(12) United States Patent
How et al.

(10) Patent No.: US 9,927,478 B2
(45) Date of Patent: Mar. 27, 2018

(54) CONFIGURABLE ELECTRONIC DEVICE TESTER SYSTEM

(71) Applicant: AEM SINGAPORE PTE. LTD., Singapore (SG)

(72) Inventors: Boon Hua How, Singapore (SG); Kok Keong Ong, Singapore (SG); Chiang Huan Saw, Singapore (SG); See Jean Chan, Singapore (SG); Wee Tick Lo, Singapore (SG)

(73) Assignee: AEM SINGAPORE PTE. LTD., Singapore (SG)

( * ) Notice: Subject to any disclaimer, the term of this patent is extended or adjusted under 35 U.S.C. 154(b) by 185 days.

(21) Appl. No.: 14/923,724

(22) Filed: Oct. 27, 2015

(65) Prior Publication Data

US 2017/0010313 A1   Jan. 12, 2017

(30) Foreign Application Priority Data

Jul. 10, 2015 (SG) .............................. 10201505439T

(51) Int. Cl.
*G01R 31/00* (2006.01)

(52) U.S. Cl.
CPC .................................. *G01R 31/003* (2013.01)

(58) Field of Classification Search
None
See application file for complete search history.

(56) References Cited

U.S. PATENT DOCUMENTS

| 6,903,567 B2 * | 6/2005 | Chung | G01R 31/2893 324/757.01 |
| 9,285,416 B2 * | 3/2016 | Lee | G01R 31/2808 |
| 9,459,302 B2 * | 10/2016 | Oh | G01R 31/003 |

* cited by examiner

*Primary Examiner* — Paresh Patel
(74) *Attorney, Agent, or Firm* — Nath, Goldberg & Meyer; Jerald L. Meyer; Stanley N. Protigal

(57) ABSTRACT

A configurable electronic test system that is adapted for varying test processes and thermal conditions, consisting of a device handler working with multiple testers and a thermal environment module for controlling the thermal condition during test. The test system can be easily expanded by stacking more testers vertically for more test capacity without requiring an increase in floor space.

14 Claims, 7 Drawing Sheets

CONFIGURABLE ELECTRONIC DEVICE TESTER SYSTEM

TECHNICAL FIELD

The present disclosure relates generally to test systems for testing electronic devices.

BACKGROUND

Electronic devices are typically tested prior to installation or delivery to ensure proper functioning thereof. Replacement of electronic devices following installation or delivery is both time-consuming and expensive. Accordingly, defective electronic devices must be discovered and discarded if at all possible, prior to installation and delivery. Testing is thus seen to be a mandatory preliminary step, particularly as the increasing complexity of electronic devices results in greater dependency on their proper functioning. Existing electronic device test systems have a major disadvantage. At one end of a typical test set up spectrum, only one test environment is provided and changing of environmental parameter such as temperature and test circuit from one to another requires a totally new setup and a significant set up time. The down-time during set up reduces the system utilization rate and consequently the production throughput. At the other end of the test set up spectrum, multiple test environments of different environmental parameters and test circuits to cater to test environments beyond what is typically required are provided which significantly increases the cost of the set up. There is hence a need for an improved system for addressing the current issues.

SUMMARY

In a first aspect of the invention, there is disclosed a configurable electronic device tester system comprising an adaptor structure and a handler unit. The adaptor structure is configurable to establish a test environment based on at least one environmental parameter and at least one of a plurality of test circuits couplable with the adaptor structure. The adaptor structure further data couples the at least one of a plurality of test circuits to a manifold when coupled with the adaptor structure. The handler unit is for receiving an arrangement of a plurality of electronic devices and for positioning the plurality of electronic devices in the test environment for testing by the at least one of a plurality of test circuits based one the at least one environmental parameter. The manifold is couplable to a control system for enabling controlling the at least one of a plurality of test circuits during testing of the plurality of electronic devices in the test environment, the at least one environmental parameter and the at least one of a plurality of test circuits being selectively variable for selective configuring of the test environment prior to positioning the plurality of electronic devices in the test environment.

In a second aspect of the invention, there is disclosed a configurable electronic device tester system comprising an adaptor structure and a handler unit. The adaptor structure is for receiving a plurality of test cells and a plurality of test modules with the plurality of test modules having different test circuits. Each of the plurality of test cells is associated with at least one of the plurality of test modules. The adaptor structure is adapted for environmentally conditioning the plurality of test cells when received thereby. The handler unit is for receiving an arrangement of a plurality of electronic devices with the handler for positioning the plurality of electronic devices at least one of to and between the plurality of test cells to enable selective application of the different test circuits of the plurality of test modules to the plurality of electronic devices for testing thereof. The adaptor structure further data couples the plurality of test cells and the plurality of test modules to a manifold when received by the adaptor structure, the manifold being coupleable to a control system for controlling the plurality of test cells and the plurality of test modules during testing of the plurality of electronic devices.

In a third aspect of the invention, there is disclosed an electronic device tester comprising a test cell and a test module. The test cell is for receiving a plurality of electronic devices and the test module has a test circuit applicable to for testing of the plurality of electronic devices via the test cell. The electronic device tester is adapted for coupling with a configurable test system comprising an adaptor structure, a handler unit and a control system. Then adaptor structure is for receiving the test cell and the test module and for environmentally conditioning the test cell when received thereby. The handler unit is for positioning the plurality of electronic devices to the test cell, and the control system is being data coupled to the test cell and the test module for controlling the test cell and the test module during testing of the plurality of electronic devices.

DETAILED DESCRIPTION

Figure 1:
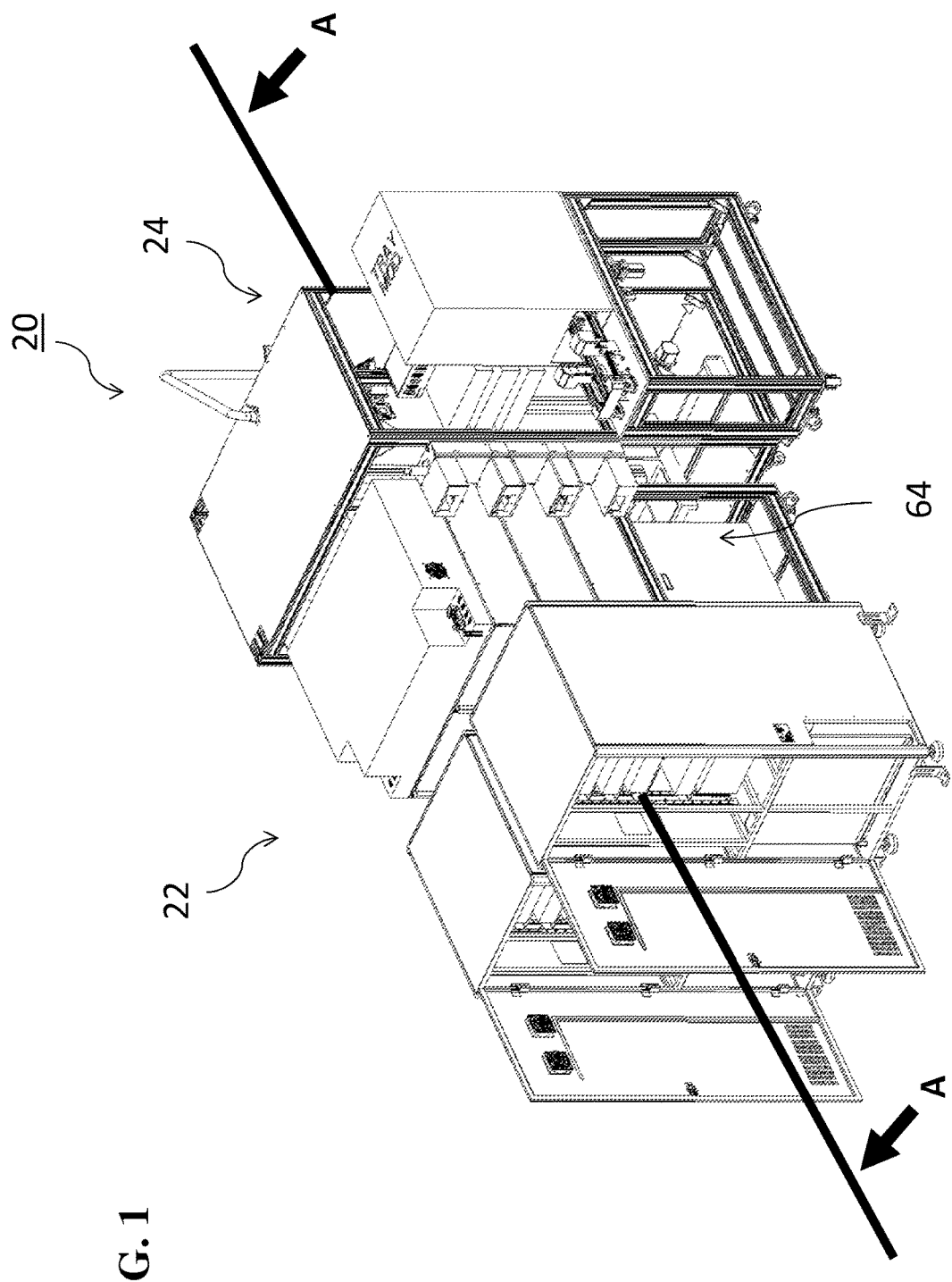
FIG. 1 shows a front perspective view of an electronic device tester system according to an embodiment of the invention.
Figure 2:
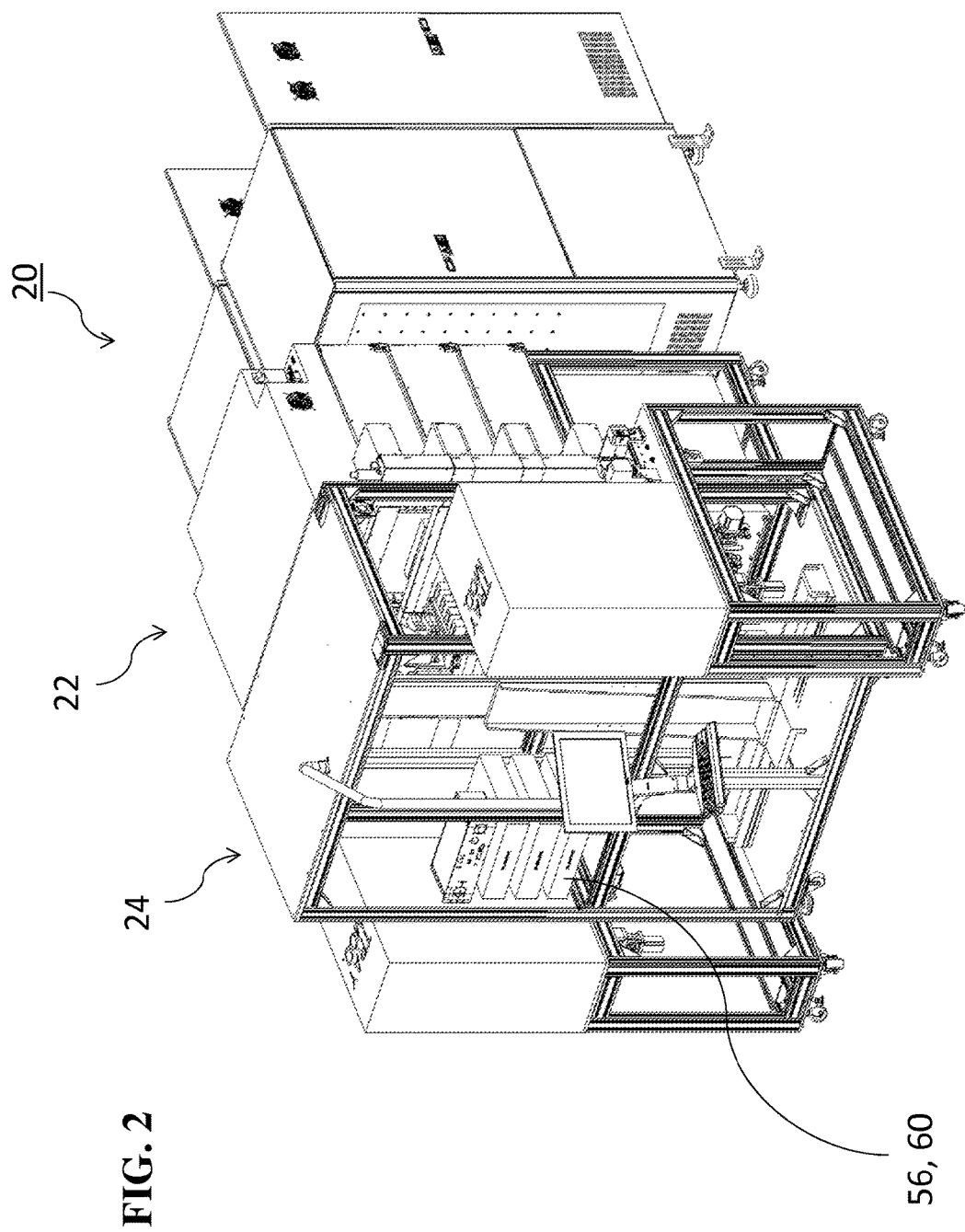
FIG. 2 shows a rear perspective view of the electronic device tester system of FIG. 1.
Figure 3:
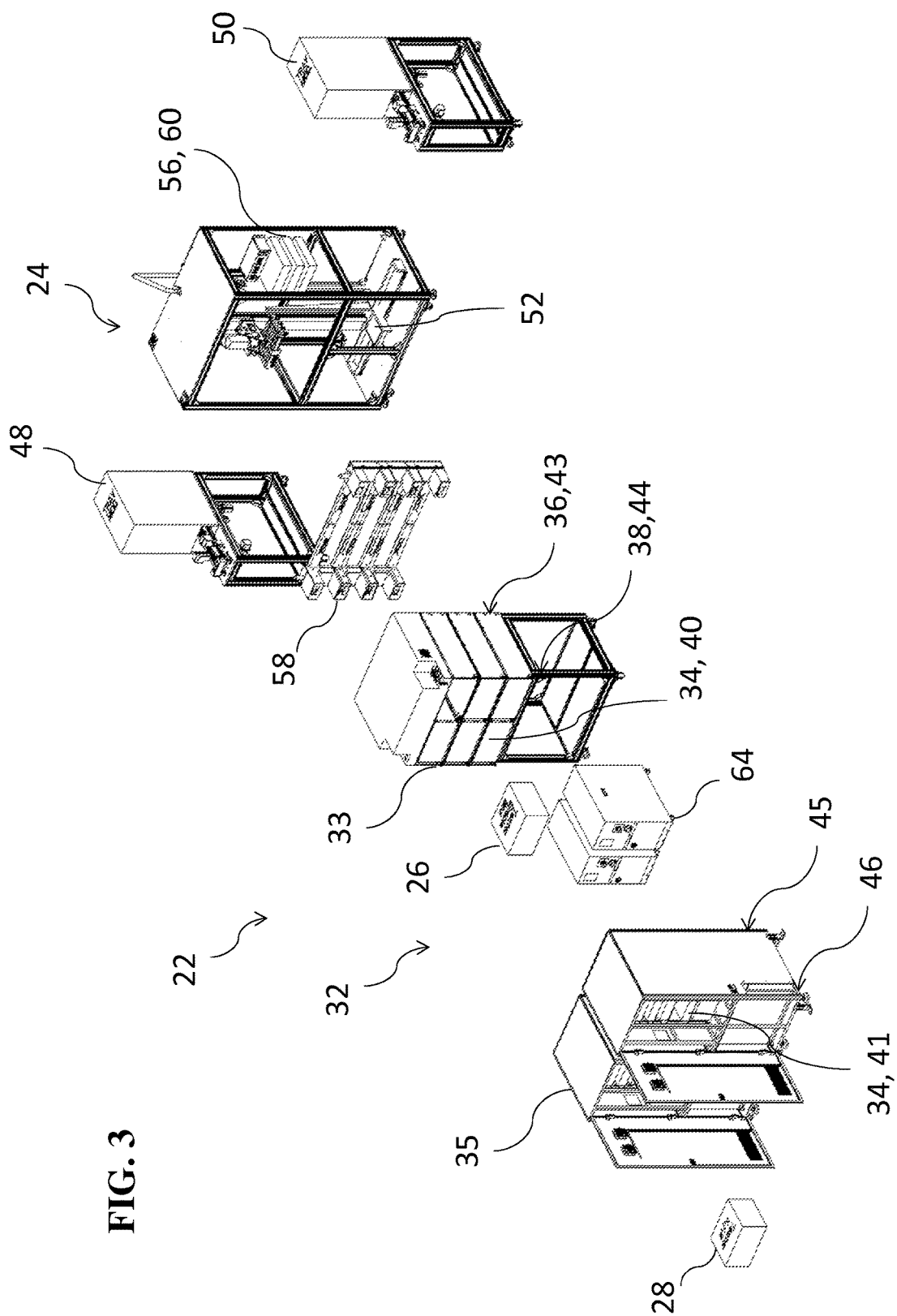
FIG. 3 shows an exploded front perspective view of the electronic device tester system of FIG. 1 exposing a tester chassis for forming an adaptor structure.
Figure 4:
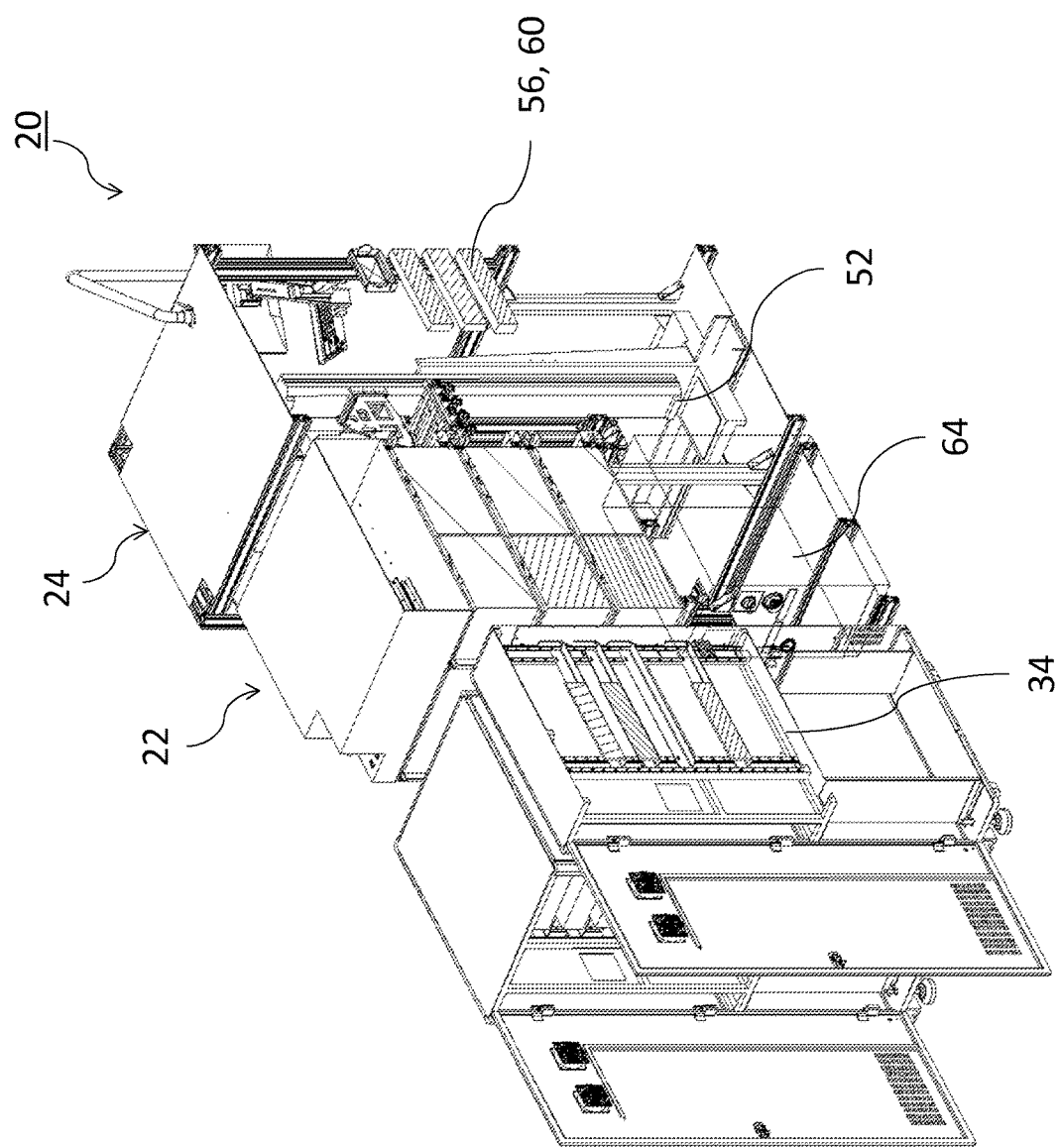
FIG. 4 shows a front sectional perspective view of the electronic device tester system of FIG. 1 according to view A-A.
Figure 5:
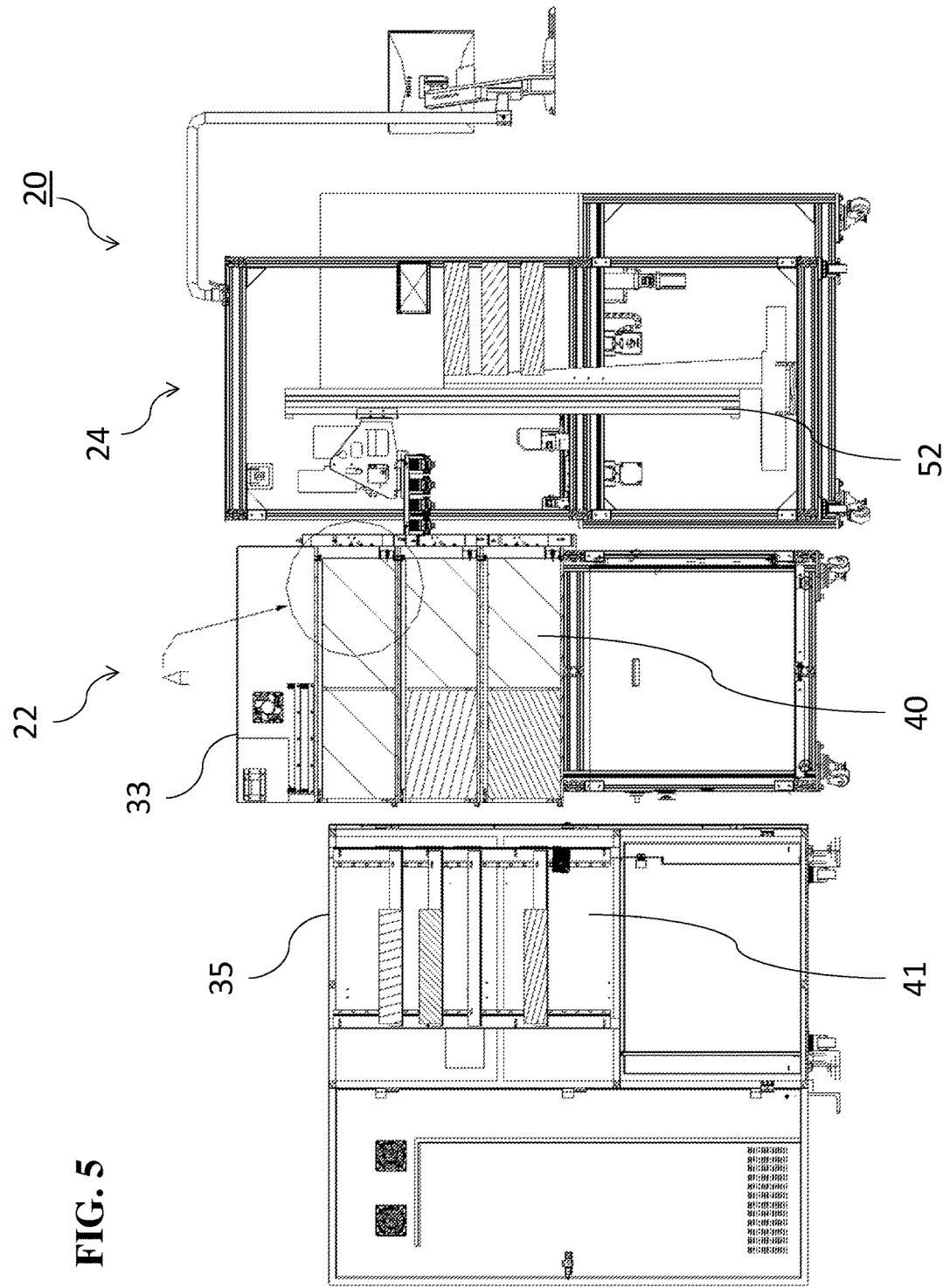
FIG. 5 shows a cross sectional view of the electronic device tester system of FIG. 1 according to view A-A.
Figure 6:
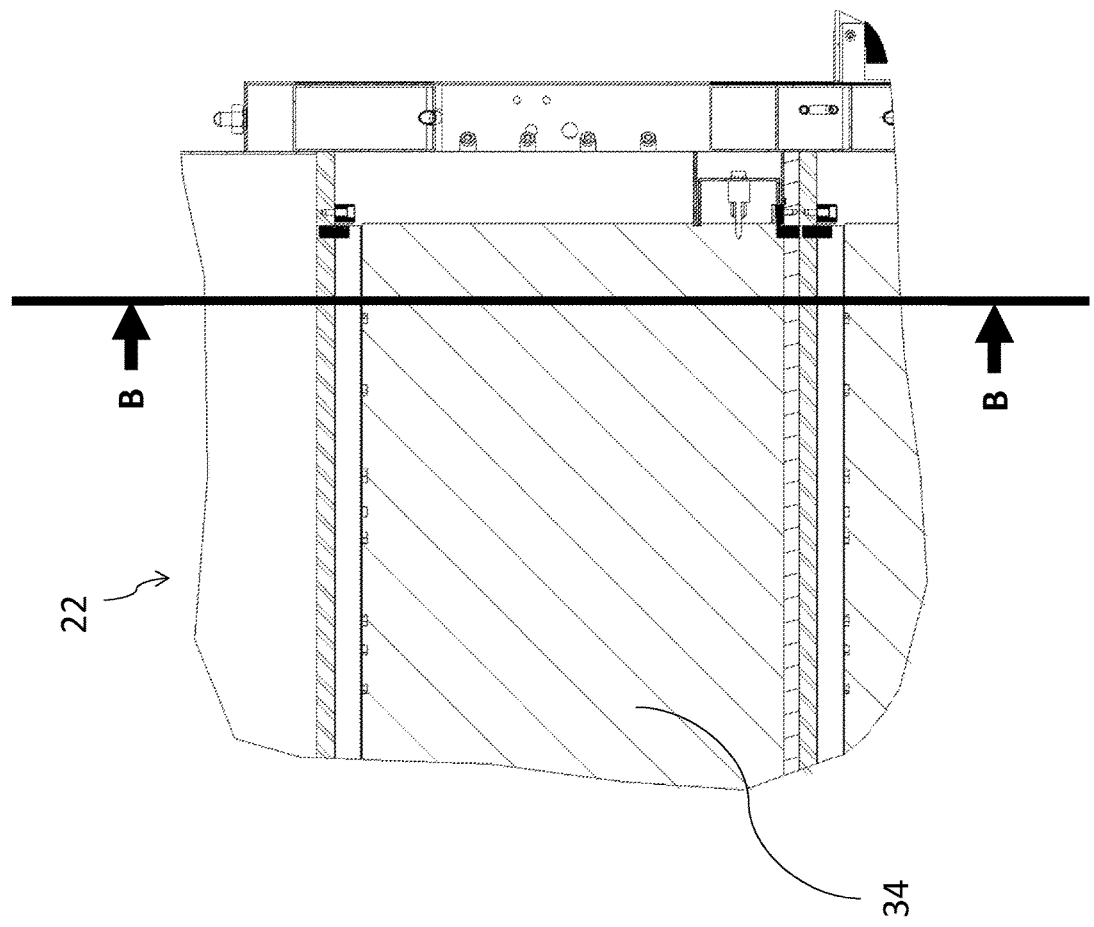
FIG. 6 shows a partial front sectional view of the tester chassis of FIG. 3 according to view A-A of FIG. 1.
Figure 7:
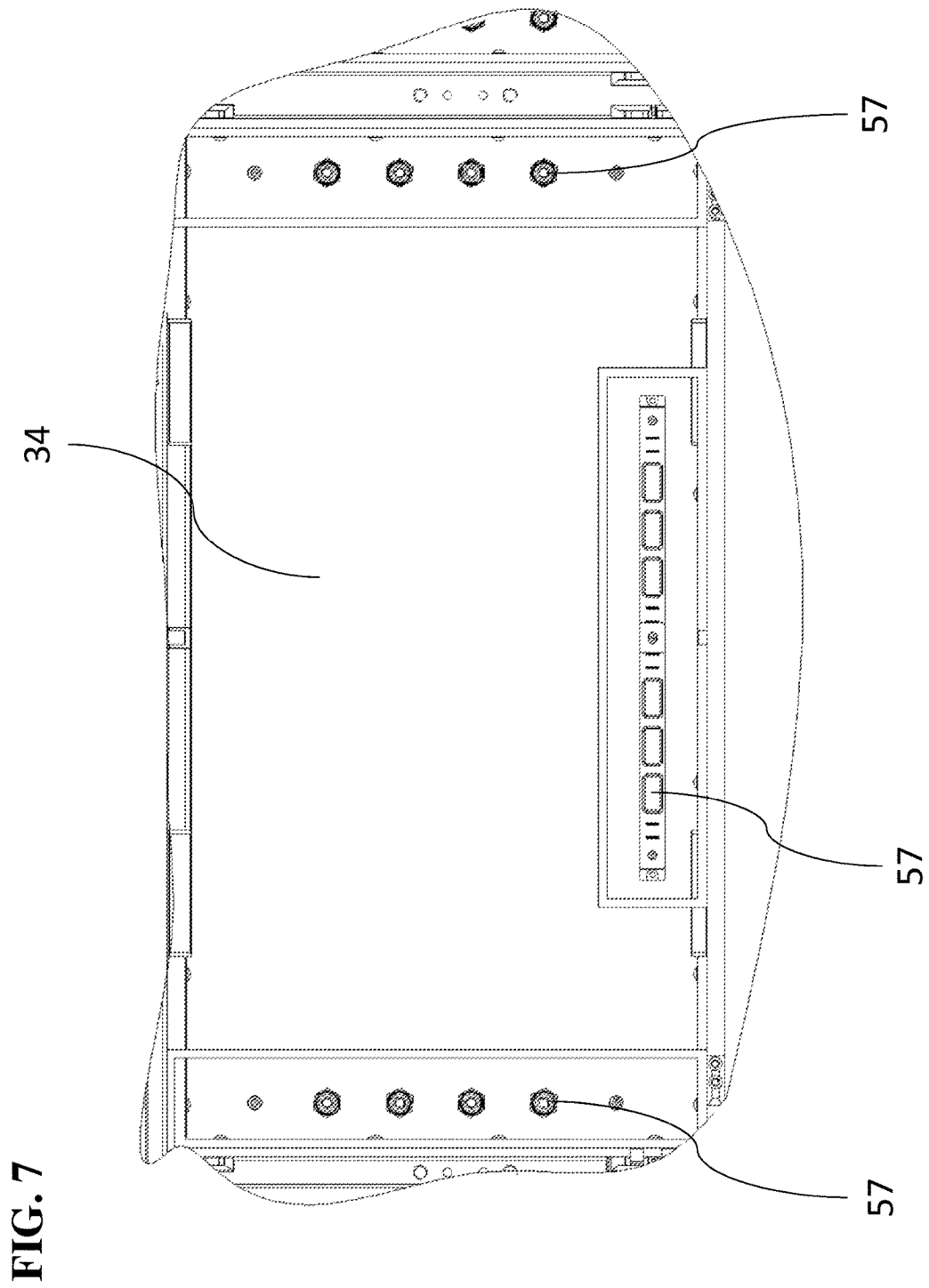
FIG. 7 shows a partial side sectional view of the tester chassis of FIG. 3 according to view B-B of FIG. 6.

An exemplary embodiment of the present invention, a configurable electronic device tester system 20, is described hereinafter with reference to FIG. 1 to FIG. 7. The configurable electronic device tester system 20 comprises an adaptor structure 22 and a handler unit 24. The adaptor structure 22, is for establishing a test environment based on at least one environmental parameter and at least one of a plurality of test circuits. The environmental parameter can be a parameter based on temperature, humidity and pressure. The test circuits can consist of electronic circuits, programmable controllers and computer systems, running test programs and test patterns, adapted for performing plurality of tests.

The adaptor structure 22 is further adapted for receiving a plurality of test cells 26 and a plurality of test modules 28 having different test circuits. The adaptor structure 22 comprises a tester chassis 32 constructed for defining one or more docking conduits 34. Each docking conduit 34 is adapted for receiving one of the test cells 26 and one of the test modules 28 based on test configuration requirements.

Each of the docking conduits 34 has a first end 36 proximal the handler unit 24 and a second end 38 distal the handler unit 24. The test modules 28 and the test cells 26 are disposable into and away from the docking conduit 34 through the second end 38. When disposed in the docking conduit 34, the test modules 28 and the test cell 26 in each thereof is aligned for substantially presenting the test cell 26 towards the handler unit 24 at the first end 36 of the docking conduit 34. The tester chassis 32 can comprise a front rack 33 and a rear rack 35 for segregating each of the docking conduit 34 into a font conduit segment 40 and a rear conduit segment 41. The front rack 33 is constructed for defining the front conduit segment 40 of each of the one or more of the docking conduits 34 while the rear rack 35 is constructed for defining the rear conduit segment 41 of each of the one or more of the docking conduits 34. Each of the front conduit segment 40 has a first end 43 proximal the handler unit 24 and a second end 44 distal the handler unit 24. The test cells 26 are disposable into and away from the front conduit segment 40 through the second end 44. Each of the rear conduit segment 41 has a first end 45 proximal the front conduit segment 40 and a second end 46 distal the front conduit segment 40. The test modules 28 are disposable into and away from the rear conduit segment 41 through the second end 46.

The test cell 26 functions as a test enabler box and is adapted for receiving an electronic device for testing. The electronic device is disposed to the test cell 26 by the handler unit 24 when the test cell 26 is presented towards the handler unit 24 at the first end 36 of the docking conduit. The electronic device can be a component such as a packaged integrated circuits or a fully functional product such as a mobile phone. The electronic device under testing is commonly referred to in the industry as a Device Under Test (DUT). The tester chassis 32 uses a pneumatic system that delivers suction and air to the test enabler boxes for holding the DUT during test and displacing the DUT after test respectively. The suction and air is also communicable to the plurality of test cells for conditioning at least one of temperature, pressure and humidity within the test enabler boxes. The test module 28 functions as a tester and is adapted for performing various tests, such as structural and functional tests, based on the test circuits, test programs and test patterns contained in and defined by the test module 28. One test cell 26 is associated with at least one test module 28. The tester system 20 requires a minimum of one test cell 26 and one test module 28 for a test operation. Additional test cells 26 and test modules 28 can be added to the tester system 20. The maximum number of test cells 26 and test modules 28 that the tester system 20 can accommodate depends on the number of docking conduits in the tester chassis 32. Additional tester chassis 32 can be added to the tester system 20 to increase the number of docking conduits, and thus the number of test cells 26 and test modules 28.

The handler unit 24 is adapted for receiving an arrangement of a plurality of the electronic devices with the handler unit 24 for positioning the plurality of electronic devices at least one of to and between the plurality of test cells 26 to enable selective application of the different test circuits of the plurality of test modules 28 to the plurality of electronic devices for testing thereof. The handler unit 24 comprises an input tray module 48, an output tray module 50 and a DUT handler 52. The input tray module 48 holds the new electronic devices to be tested while the output tray module 50 holds the electronic devices which have been tested. The DUT handler 52 is preferably a robotic system having a SCARA configuration or the like multiple degrees-of-freedom (DOF) configuration. Alternatively, a motorised linear translational stage system can be used in replacement of the robotic system. The DUT handler 52 is for picking up the electronic devices from the input tray module 48, disposing the electronic devices to the test cells 26 for testing, displacing them away from the test cells 26 after testing and unloading them to the output tray module 50.

The configurable electronic device tester system 20 further comprises a control system 56 and a environment conditioning module 58. The control system 56 is adapted for controlling and coordinating the activities of the tester system. The control system 56 comprises computers 60 and software. The computers can be off-the-shelf PCs with specifications suitable for performing the required functions. The software consists of custom-built applications suitable for running on the computers and providing the functions required by the tester system. Alternatively, the control system 56 can comprise programmable controllers with pre-programmed logics or controller boards with hardwired logic for operating the tester system 20. Data connection is made between the DUT handler 52 and the control system 56 to enable the control system 56 to selectively position the electronic devices to be tested in the test cells 26 for testing by the associated test modules 28. The DUT handler positions the electronic device in test cells 26 according to the sequence of tests programmed for each particular type of the electronic device to be tested.

The adaptor structure 22 further data couples the plurality of test cells 26 and the plurality of test modules 28 to a manifold when received by the adaptor structure 22, the manifold being coupleable to the control system 56 for controlling the plurality of test cells and the plurality of test modules during testing of the plurality of electronic devices. When the test cells 26 and test modules 28 are displaced into the tester chassis 32, data connection is made between them and the control system 56. The control system 56 controls the tests carried out on the DUTs in test cells 26 by the test modules 28. The control components in each of the test cells 26 communicate with the control system 56 through an interface in the tester chassis 32 when the test cells 26 are displaced into the tester chassis 32. The control components in the test cell 26 include sensors, actuators, motors and electronic components. After the testing, the control system 56 communicates with the DUT handler 52 to sort the devices according to the test results, commonly known in the industry as BIN. The DUT handler 52 transfers the electronic devices to respective output tray modules 50 based on the BIN of the electronic devices.

The manifold comprises connectors 57 which are shaped and positioned for engagement with corresponding connectors formed with the test cells 26 and test modules 28 to enable communication of the fluids, for example refrigerants and air, electrical power and electrical signals, for example data signals, therewith. Communication between the test cells 26 and the test modules 28 with the manifold is established upon docking thereof with the tester chassis 32. Data, fluid and power supply communication between the control system 56 and each of the test cells 26 and the test modules 28 are established via the manifold. Further, data, fluid and power supply communication between the test modules 28 and the control system 56 can be further routed, in totally or in part, via one or more of the test cells 26 coupled with the manifold. Each of the test cells 26 can comprise connectors at opposite ends, sides or extremities thereof with the connectors at one end of the test cell 26 for connecting with the corresponding connectors 57 on the manifold, and connectors at the other end of the test cell 26 for connecting with corresponding connectors formed on the test modules 28.

The environment conditioning module 58 provides the thermal conditioning of the test cells 26 for establishing the test environment according to the requirements of the tests. The environment conditioning module 58 provides the test cells 26 with the required thermal condition by being proximal to the test cells 26 through physically wrapping around the test cells 26. Alternatively, the thermal conditioning can be delivered to the test cells 26 through insulated tubes. The environment conditioning module 58 works with the chiller and heat exchanger 64 to change the test environment in the test cells 26. The chiller and heat exchanger 64 varies the temperature using water, coolant, refrigerant or other heat transfer fluids. After the test cells 26 are environmentally set up, the electronic device is put through a plurality of tests in plurality of test cells 26 such as room temperature test, cold test and standard life-cycle test (e.g. burn-in test).

Each test cell 26 and test module 28 has a unique identifier. The unique identifier can be a code contained in a semiconductor chip, for example a memory chip, on the test cell 26 or test module 28 for associating the test cell 26 and the test module 28 with one of a variety of tests that can be performed on the electronic devices, for identifying the test circuit contained in the test module 28 and for indicating acceptable configurations of the electronic devices that are receivable by the test cell 26. In this form, the identifier information is retrieved by the control system 56 with the control system 56 reading the information on the chip through the data coupling between the control system 56 and the test cell 26 or test module 28. Alternatively, the unique identifier can be a machine readable code such as a one dimensional barcode, a two dimensional barcode or an RFID tag that is attached to the test cell 26 or test module 28. In this alternative form, the identifier information is retrieved by the control system 56 with the control system 56 activating a scanning or reading function through the data connection between the control system 56 and barcode scanner or RFID reader. The unique identifiers enable the control system 56 to identify the positions of the test cells 26 and the test capabilities of the test modules 28 while they are disposed in the docking conduits 34 of the tester chassis 32. The control system 56 uses the position and test capability information to coordinate the test activities.

Each tray in the input tray module 48 and output tray module 50 has a unique identifier. Due to the mechanical nature of the tray, the unique identifier is preferably a machine readable code such as a barcode (one, two or multi-dimensional) or a RFID tag that is attached to the tray. The identifier information is retrieved by the control system 56 with the control system 56 activating a scanning or reading function through the data connection between the control system 56 and the barcode scanner or RFID reader. The unique identifiers enable the control system to identify the positions of the trays and the electronic devices contained therein while they are disposed in the input and output tray module. The control system 56 uses the position and electronic device information to activate the DUT handler 52 to pick the correct electronic device or tray of electronic devices from the input tray module 48 and displace it to the test cells 26 for testing. After the testing, the control system 56 uses the test results (BIN) and tray identifier information to sort the electronic devices and unload them to the output tray module 50.

Aspects of particular embodiments of the present disclosure address at least one aspect, problem, limitation, and/or disadvantage associated with existing electronic device tester systems. While features, aspects, and/or advantages associated with certain embodiments have been described in the disclosure, other embodiments may also exhibit such features, aspects, and/or advantages, and not all embodiments need necessarily exhibit such features, aspects, and/or advantages to fall within the scope of the disclosure. It will be appreciated by a person of ordinary skill in the art that several of the above-disclosed structures, components, or alternatives thereof, can be desirably combined into alternative structures, components, and/or applications. In addition, various modifications, alterations, and/or improvements may be made to various embodiments that are disclosed by a person of ordinary skill in the art within the scope of the present disclosure, which is limited only by the following claims.

The invention claimed is:

1. A configurable electronic device tester system comprising:
   an adaptor structure being configurable to establish a test environment based on at least one environmental parameter and at least one of a plurality of test circuits contained in at least one of a plurality of test modules couplable with the adaptor structure, wherein the adaptor structure comprises
   a plurality of docking conduits,
   a manifold at an end of each docking conduit, the manifold configured for engagement with at least one of a plurality of test cells and the at least one of the plurality of test modules to enable communication of fluids, electrical power and electrical signals therewith; and
   a handler unit for receiving an arrangement of a plurality of electronic devices and for positioning at least one of the plurality of electronic devices in the at least one of the plurality of test cells with the test environment for testing by the at least one of a plurality of test circuits based on the at least one environmental parameter,
   wherein the manifold is couplable to a control system for enabling control of the at least one of the plurality of test circuits in the at least one of the plurality of test modules and the test environment in the at least one of the plurality of test cells during testing of the plurality of electronic devices, the at least one environmental parameter and the at least one of the plurality of test circuits being selectively variable for selective configuring of the test environment prior for testing of the plurality of electronic devices in the test environment.

2. The system as in claim 1, further comprising:
   the plurality of test cells and the plurality of test modules being receivable by the adaptor structure, the plurality of test modules containing the plurality of test circuits, each of the plurality of test cells being associated with at least one of the plurality of test modules, the adaptor structure being adapted for environmentally conditioning the plurality of test cells when received thereby for establishing the test environment, the handler unit further for positioning the plurality of electronic devices to or between the plurality of test cells to enable selective application of the plurality of test circuits of the plurality of test modules to the plurality of electronic devices for testing thereof,
   wherein the adaptor structure further data couples the plurality of test cells and the plurality of test modules to the manifold when received by the adaptor structure.

3. The system as in claim 2, the manifold further data-couples the handler unit with the control system to enable control of selective positioning of the plurality of the electronic devices to at least one of the plurality of test cells by the control system for testing by at least one of the plurality of test modules associated therewith.

4. The system of claim 2, the adaptor structure comprising an environment conditioning module for providing each of the plurality of test cells with at least one of thermal conditioning and actuation control for establishing the test environment.

5. The system of claim 4, wherein the environment conditioning module utilises at least one of water, coolant, refrigerant and heat transfer fluids for thermal conditioning thereof.

6. The system of claim 2, the adaptor structure comprising a pneumatic interface for communicating at least one of air and vacuum to the plurality of test cells when received by the adaptor structure.

7. The system of claim 6, the at least one air and vacuum being communicable to the plurality of test cells for at least one of displacement actuation and suction actuation within the plurality of test cells.

8. The system as in claim 6, the at least one air and vacuum being communicable to the plurality of test cells for conditioning at least one of temperature, pressure and humidity within the test cell.

9. The system of claim 4, wherein the actuation control being from at least one of air, vacuum and electrical drive actuation.

10. The system of claim 4, the environmental conditioning module being couplable with at least one fluid supply for receiving fluids therefrom.

11. The system of claim 2, each of the plurality of test cells comprising a plurality of control components which are electrically and data communicated with the control system via the manifold when the plurality of test cells are received by the adaptor structure.

12. The system of claim 11, the plurality of control components comprising at least one of sensors, actuators, motors and electronic components.

13. An electronic device tester comprising:
   a test cell for receiving a plurality of electronic devices; and
   a test module having a test circuit applicable to for testing of the plurality of electronic devices via the test cell, the electronic device tester being adapted for coupling with a configurable test system comprising:
      an adaptor structure having
         a docking conduit for receiving the test cell and the test module, and
         a manifold at an end of the docking conduit, the manifold configured for engagement with the test cell and the test module to enable communication of fluids, electrical power and electrical signals therewith,
      a handler unit for positioning the plurality of electronic devices to the test cell; and
      a control system being coupled to the manifold for environmentally conditioning the test cell and for controlling the test module during testing of the plurality of electronic devices.

14. The system as in claim 13, the control system further being data coupled to the handler unit to enable control of positioning of the plurality of the electronic devices to the test cell by the control system.

* * * * *

UNITED STATES PATENT AND TRADEMARK OFFICE
CERTIFICATE OF CORRECTION

PATENT NO. : 9,927,478 B2
APPLICATION NO. : 14/923724
DATED : March 27, 2018
INVENTOR(S) : Boon Hua How et al.

Page 1 of 1

It is certified that error appears in the above-identified patent and that said Letters Patent is hereby corrected as shown below:

In the Claims

Claim 2, Column 6, Line 51, please remove "as in" and replace with "of".
Claim 3, Column 7, Line 1, please remove "as in" and replace with "of".
Claim 8, Column 7, Line 25, please remove "as in" and replace with "of".
Claim 10, Column 7, Line 32, please remove "environmental" and replace with "environment".
Claim 14, Column 8, Line 29, please remove "system as in" and replace with "electronic device tester of".

Signed and Sealed this
Eighteenth Day of September, 2018

Andrei Iancu
*Director of the United States Patent and Trademark Office*